United States Patent
Rhie (10) Patent No.: US 10,998,048 B2
(45) Date of Patent: *May 4, 2021

(54) INTEGRATED ERASE VOLTAGE PATH FOR MULTIPLE CELL SUBSTRATES IN NONVOLATILE MEMORY DEVICES

(71) Applicant: Conversant Intellectual Property Management Inc., Ottawa (CA)

(72) Inventor: Hyoung Seub Rhie, Ottawa (CA)

(73) Assignee: Conversant Intellectual Property Management Inc., Ottawa (CA)

(*) Notice: Subject to any disclaimer, the term of this patent is extended or adjusted under 35 U.S.C. 154(b) by 0 days.

This patent is subject to a terminal disclaimer.

(21) Appl. No.: 16/580,099

(22) Filed: Sep. 24, 2019

(65) Prior Publication Data

US 2020/0020401 A1  Jan. 16, 2020

Related U.S. Application Data

(63) Continuation of application No. 15/612,294, filed on Jun. 2, 2017, now Pat. No. 10,460,807, which is a continuation of application No. 13/830,135, filed on Mar. 14, 2013, now Pat. No. 9,704,580.

(60) Provisional application No. 61/716,852, filed on Oct. 22, 2012.

(51) Int. Cl.
*G11C 16/14* (2006.01)
*G11C 16/06* (2006.01)

(52) U.S. Cl.
CPC .............. *G11C 16/06* (2013.01); *G11C 16/14* (2013.01)

(58) Field of Classification Search
CPC ...................................................... G11C 16/14
USPC .................................................... 365/185.11
See application file for complete search history.

(56) References Cited

U.S. PATENT DOCUMENTS

| 9,704,580 B2 * | 7/2017 | Rhie | G11C 16/06 |
| 2009/0175081 A1 * | 7/2009 | Kim | G11C 16/3427 |
| | | | 365/185.11 |
| 2012/0063235 A1 * | 3/2012 | Yoon | G11C 16/0483 |
| | | | 365/185.23 |
| 2012/0161094 A1 * | 6/2012 | Huo | H01L 27/249 |
| | | | 257/4 |
| 2013/0229871 A1 * | 9/2013 | Li | H01L 29/7926 |
| | | | 365/185.11 |

* cited by examiner

*Primary Examiner* — Min Huang
(74) *Attorney, Agent, or Firm* — Conversant IP Management Corp (57) ABSTRACT

A non-volatile memory device using existing row decoding circuitry to selectively provide a global erase voltage to at least one selected memory block in order to facilitate erasing of all the non-volatile memory cells of the at least one selected memory block. More specifically, the erase voltage is coupled to the cell body or substrate of memory cells of the at least one selected memory block, where the cell body is electrically isolated from the cell body of non-volatile memory cells in at least one other memory block. By integrating the erase voltage path with the existing row decoding circuitry used to drive row signals for a selected memory block, no additional decoding logic or circuitry is required for providing the erase voltage to the at least one selected memory block.

17 Claims, 11 Drawing Sheets

INTEGRATED ERASE VOLTAGE PATH FOR MULTIPLE CELL SUBSTRATES IN NONVOLATILE MEMORY DEVICES

CROSS REFERENCE TO RELATED APPLICATIONS

This application is a continuation of U.S. application Ser. No. 15/612,294, filed on Jun. 2, 2017, which is a continuation of U.S. application Ser. No. 13/830,135, filed on Mar. 14, 2013, now issued as U.S. Pat. No. 9,704,500 issued on Jul. 11, 2017, which claims the benefit of priority of U.S. Provisional Patent Appln No. 61/716,852 filed Oct. 22, 2012, which are incorporated herein by reference.

FIELD

The present disclosure relates generally to semiconductor memory devices. More particularly, the present disclosure relates to non-volatile memory devices.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

Flash memory is organized into blocks, which are erasable. Known flash memory devices suffer inefficiencies in cost, performance and power resulting from their erase schemes. Erasing can be power inefficient as large wells within which the memory cells of the memory blocks are fabricated, are repeatedly charged and discharged during erase and erase verify operations. Accordingly, large charge pumps are needed on-chip, which occupy chip area and thereby increases chip size and cost. Furthermore, the exposure of unselected memory blocks to erase voltages used for erasing selected memory blocks can cause erase disturb, which could inadvertently change the programmed threshold voltages of the memory cells of the unselected memory blocks. This problem is exacerbated in multi-level flash cells which have tighter threshold voltage distributions and are therefore more sensitive to the effects of erase disturb.

SUMMARY

In a first aspect, the present disclosure provides a non-volatile memory having at least two groups of non-volatile memory cells and row circuitry. The at least two groups of non-volatile memory cells are each eraseable in response to an erase voltage. The row circuitry is configured to selectively provide memory array signals and the erase voltage for erasing one of the at least two groups in response to a row address. The non-volatile memory cells can be configured as NAND flash memory cell strings, and the at least two groups can include memory blocks. According to one embodiment of the present aspect, the NAND flash memory cell strings are configured as three dimensional vertical channel type NAND memory cell strings formed in a stacked configuration extending from a surface of a substrate.

In another embodiment of the present aspect, the row circuitry includes pass circuitry receiving global memory array signals and a global erase voltage, and is configured to selectively enable some of the pass circuitry for passing the global memory array signals as memory array signals and the global erase voltage as the erase voltage to the one of the at least two groups. The memory array signals can include string select, wordline and source select signals.

In an alternate embodiment, the pass circuitry is selectively enabled by a block select signal selected by the row address. In this embodiment, the pass circuitry can include pass transistors each having a first terminal for receiving one of the global memory array signals and an erase line providing the global erase voltage, a second terminal for providing one of the memory array signals and the erase voltage, and a gate terminal for receiving the block select signal.

The non-volatile memory can further include an erase circuit for driving the global erase line with the global erase voltage during an erase operation and for driving the global erase line with another voltage during read and program operations. This embodiment can further include discharge devices for connecting each local erase line to VSS in response to an erase enable signal at an inactive logic level, and the erase circuit drives the global erase line with the another voltage in response to the enable signal at the inactive logic level.

In this embodiment, the non-volatile memory cells corresponding to each of the at least two groups share a respective cell body that receives the erase voltage. Alternately, the non-volatile memory cells corresponding to both of the at least two groups share a cell body that receives the erase voltage, or the non-volatile memory cells corresponding to each of the at least two groups share a respective source line that receives the erase voltage, or the non-volatile memory cells corresponding to both of the at least two groups share a source line that receives the erase voltage.

In a further embodiment, the row circuitry includes a level shifter for providing the block select signal having a first voltage level in response to a block address signal having a second voltage level less than the first voltage level, and the row circuitry further includes a block decoder for providing the block address signal in response to the row address.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides a non-volatile memory device using existing row decoding circuitry to selectively provide a global erase voltage to at least one selected memory block in order to facilitate erasing of all the non-volatile memory cells of the at least one selected memory block. More specifically, the erase voltage is coupled to the cell body or substrate of memory cells of the at least one selected memory block, where the cell body is electrically isolated from the cell body of non-volatile memory cells in at least one other memory block. By integrating the erase voltage path with the existing row decoding circuitry used to drive row signals for a selected memory block, no additional decoding logic or circuitry is required for providing the erase voltage to the at least one selected memory block.

Figure 1A:
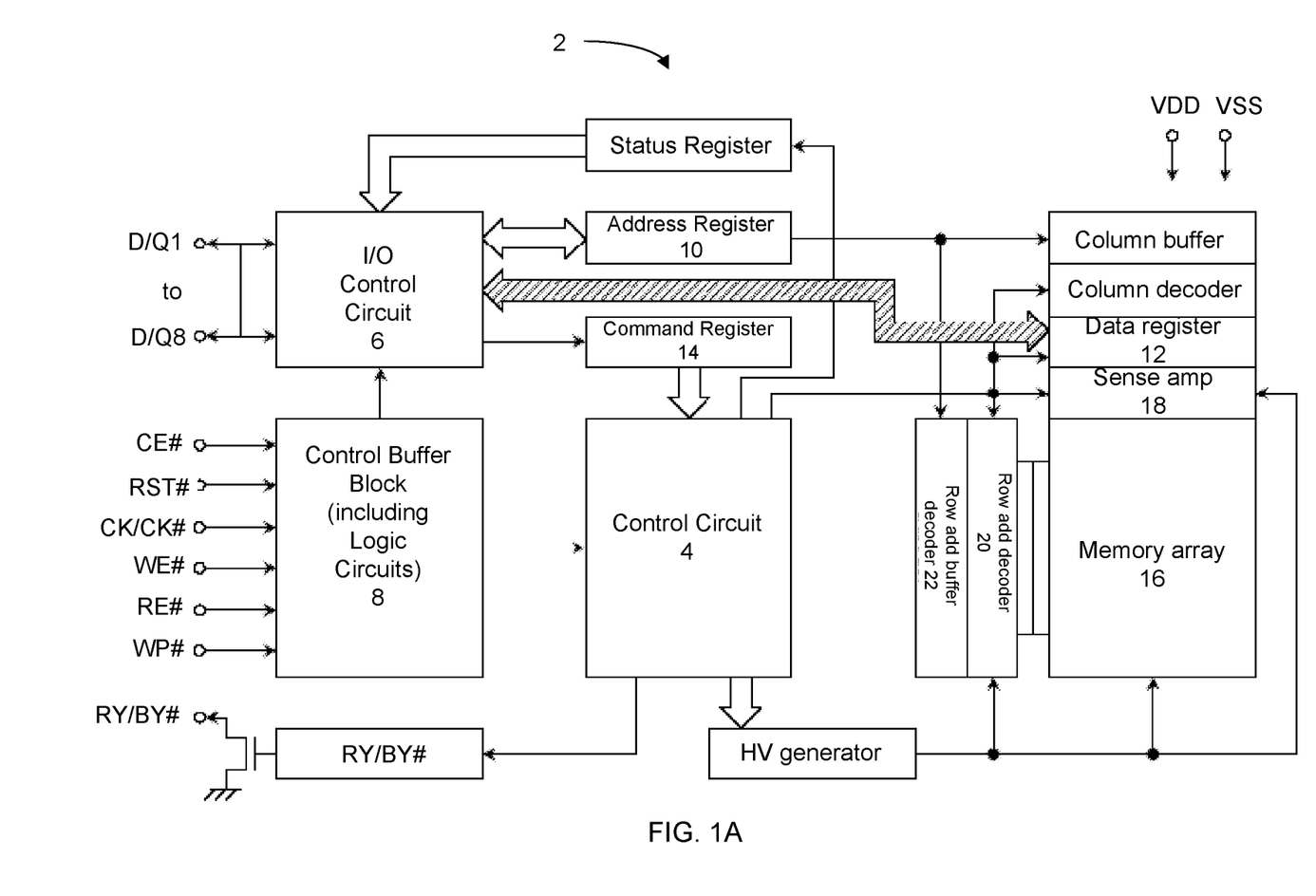
FIG. 1A is a block diagram of a flash memory device.

FIG. 1A is a general block diagram of a flash memory device which can incorporate the embodiments of the present disclosure. Flash memory 2 includes well known input and output buffer circuits, such as input/output (I/O) buffer block 6 and control buffer block 8 for receiving external control and data input signals and providing data output signals. The control buffer block 8 receives the control signals, such as CE # and WE #, may include other basic logic circuits, for implementing rudimentary functions that may be related to control of the data input and buffers for example. Flash memory 2 includes control circuit 4, for controlling various high level functions of the flash circuits such as read, program and erase operations for example, an address register 10 for storing address information, a data register 12 for storing program data information, a command register 14 for storing command data information, high voltage circuits for generating the required program and erase voltages, and core memory circuits for accessing the memory array 16. Memory array 16 includes flash memory cells, arranged as NAND cell strings for example. The NAND cell strings of a column are coupled to a bitline, which is connected to a page buffer/sense amplifier circuit 18. Sense amplifier circuit 18 senses read data from a selected page of memory cells and provides program data to a selected page of memory cells. One page of memory cells refers to all the memory cells connected to the same wordline. Driving the wordlines is row drivers/decoders, shown as a row address decoder 20 and row address buffer 22. There can be one or more hierarchical stages of decoding, and row address buffer 22 can include block decoding logic.

The control circuit 4 includes a command decoder and logic (not shown) for executing internal flash operations, such as read, program and erase functions. Those skilled in the art will understand that these operations are executed in response to the command data stored in the command register 14, sometimes in combination with the address data and program data stored in the respective address register 10 and data register 12, depending on the operation to be executed. The command data, address data and program data are issued by a memory controller and latched into the corresponding registers by flash memory 2. The functions of the shown circuit blocks of flash memory 2 are well known in the art. Persons skilled in the art will understand that flash memory 2 shown in FIG. 1A represents one possible flash memory configuration amongst many possible configurations. In FIG. 1A, memory array 16, sense amplifier circuit 18, data register 12, row address decoder 20 and row address buffer 22 are part of one memory bank.

Figure 1B:
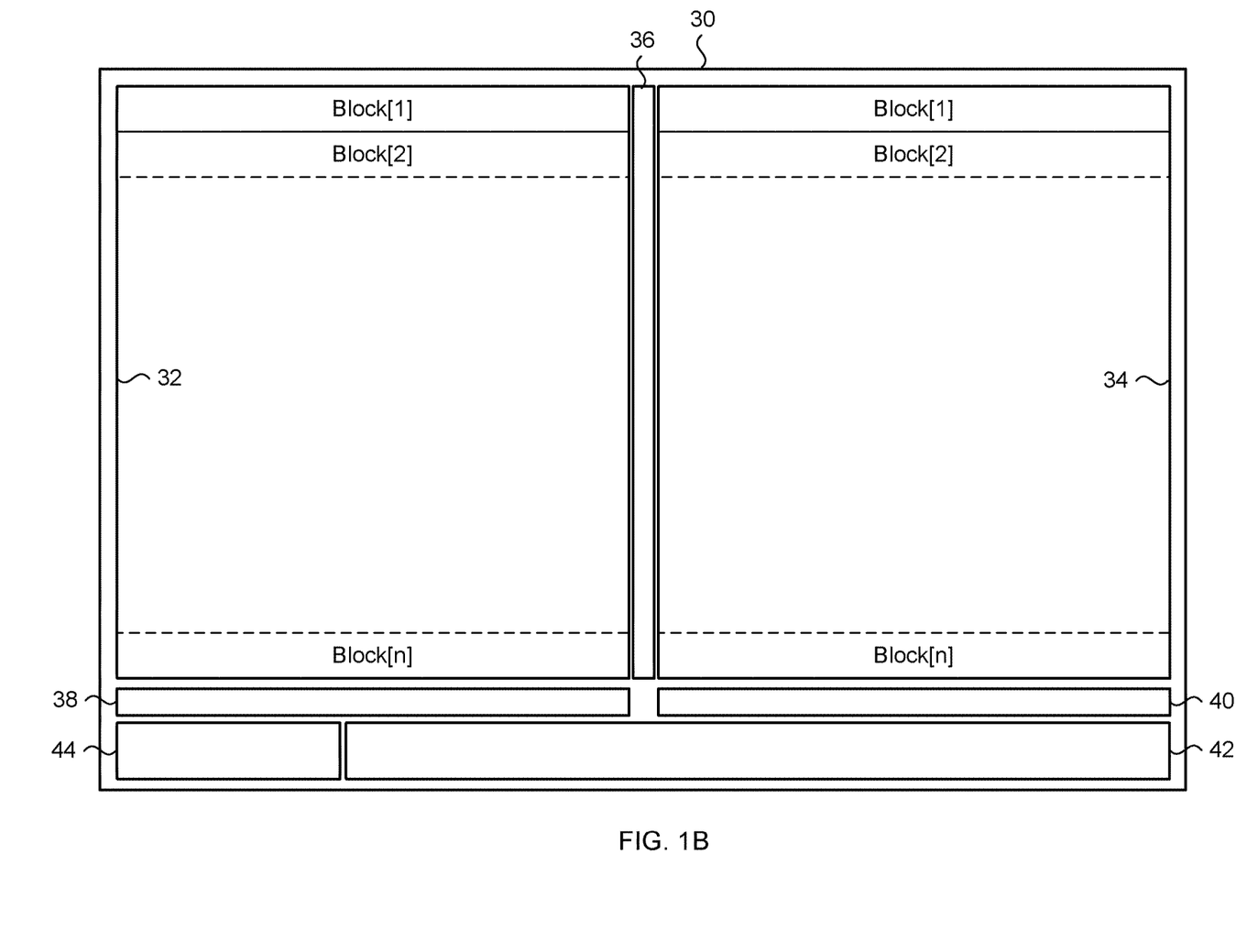
FIG. 1B is a floor plan layout a flash memory device.

FIG. 1B is a floor plan layout a prior art flash memory device to show the area occupied by various circuit blocks. Typically, all the circuit blocks shown in FIG. 1A are formed in the floor plan layout of FIG. 1B. In FIG. 1B, flash memory chip 30 is a semiconductor material rectangular in shape, upon which are formed transistor circuits and structures. Occupying a large proportion of the area are two memory arrays or memory tiles, 32 and 34, which generally correspond to memory array 16 of FIG. 1A. While the present example flash memory 30 includes two memory arrays, alternative designs can include a single memory array or more than two memory arrays. Located between memory arrays 32 and 34 are row decoders 36 that drive wordlines to the required voltage level for read, program and erase operations. Row decoders 36 generally correspond to row address decoder 20 and row address buffer 22 of FIG. 1A. In the example of FIG. 1B, wordlines (not shown) extend in a horizontal direction. Located below each of memory arrays 32 and 34 are page buffers 38 and 40, each being electrically connected to bitlines (not shown) for providing program data and for sensing read data. Page buffers 38 and 40 generally correspond to data register 12 and sense amplifier 18 of FIG. 1A. The page buffers 38 and 40 receive and provide data via data lines (not shown), which are coupled to the input and output (I/O) circuits in logic block 42. Logic block 42 further includes other circuits such as a command decoder and registers. Another large area is dedicated for at least one charge pump 44, which is responsible for generating high voltages required for programming and erasing data stored in the flash memory cells of the first memory array 32 and the second memory array 34. Charge pump 44 generally corresponds to the high voltage generator of FIG. 1A. The elements of flash memory chip 30 have been generically described, but persons skilled in the art will understand that each of the outlined blocks of FIG. 1B will include all the circuits necessary to achieve proper operation of flash memory chip 30.

In the presently shown example of FIG. 1B, the flash memory chip 30 is designed to have non-volatile memory cells arranged in NAND cell strings within memory arrays 32 and 34. The NAND cell strings are organized into memory blocks, such as Block[1] to Block[n], where n can be any non-zero integer value representing a last memory block. The selection of the number of blocks in each array is a design parameter of flash memory chip 30.

Figure 2:
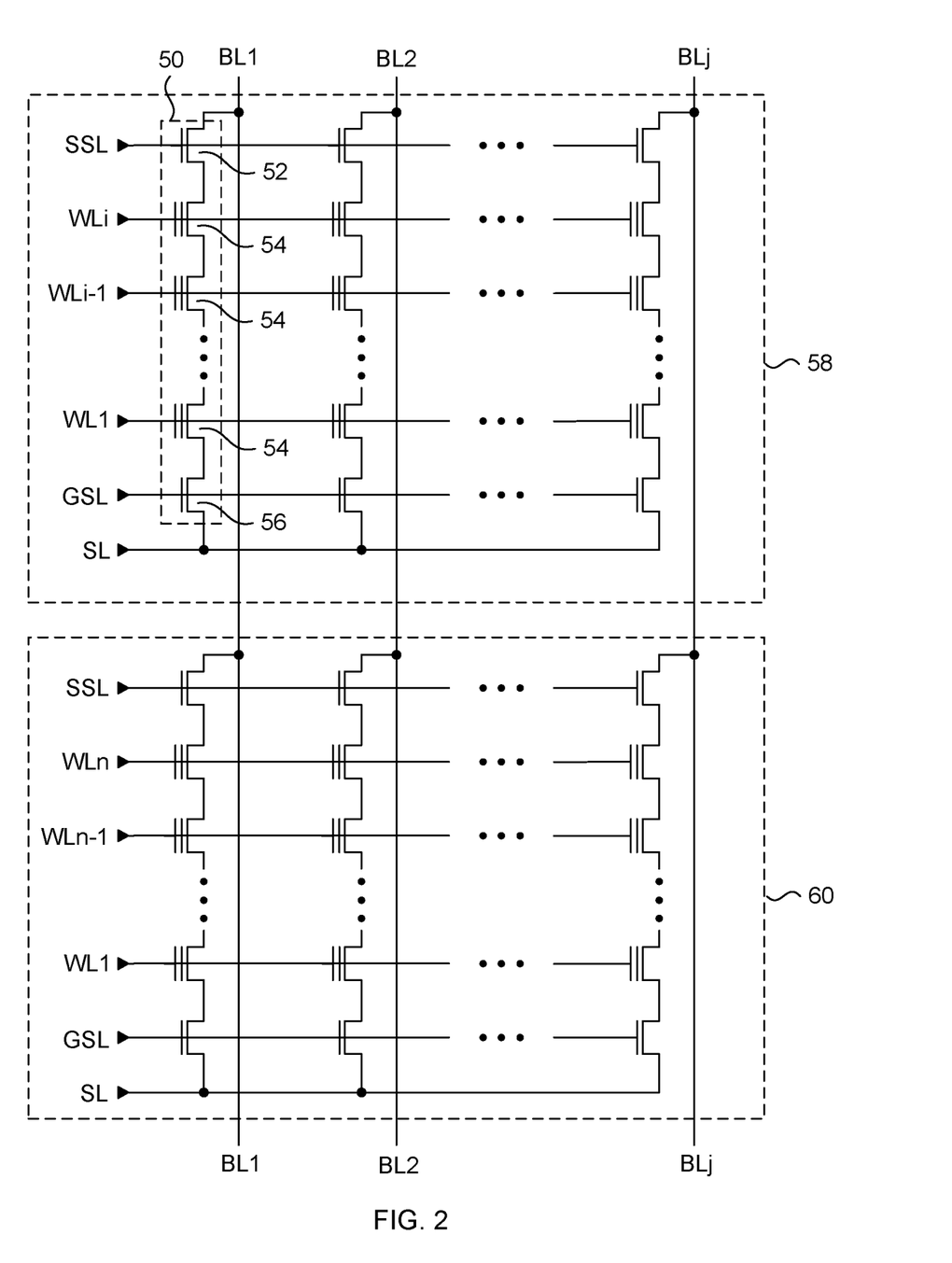
FIG. 2 is a circuit schematic showing circuit details of two memory blocks in one memory array of the flash memory device of FIG. 1B.

FIG. 2 depicts an example memory array of flash memory chip 30 of FIG. 1B. The example illustrated in FIG. 2 has two memory blocks in one memory array. In FIG. 2, one NAND cell string is outlined with a dashed box 50, which includes a string select device 52, flash memory cells 54, and a sourceline select device 56 connected in series between bitline BL1 and source line SL. There can be "i" flash memory cells 54 per NAND cell string, where "i" is a non-zero integer value indicating the last wordline of the cell string. Accordingly, wordlines WL1 to WLi are electrically coupled to corresponding gates of the flash memory cells 54. A string select line (SSL) and a source select line (GSL) are electrically coupled to select devices 52 and 56 respectively. In the present example, all the transistors of the NAND cell string 50 are n-channel devices.

A memory block 58, being the same as memory Block[1] of FIG. 1B for example, includes all the NAND cell strings having select devices and flash memory cells connected to the same wordlines, string select line and source select line. The width of memory block 58 is set by the number of bitlines, which in the case of FIG. 2 is "j" bitlines where j is a non-zero integer value. Memory block 60 includes further NAND cell strings connected to bitlines BL1 to BLj. A bitline and the NAND cell strings electrically connected to it is referred to as a column.

All the circuits of flash memory chip 30 of FIG. 1B, including the NAND cell strings shown in FIG. 2 are formed by using well-known semiconductor manufacturing processes. In such processes, transistors of the same type are grouped together and formed in their own well. For example, n-type transistors are formed in a p-type well and p-type transistors are formed in an n-type well. In some cases, only a single well is used, where its type depends on the type of the substrate. In most NAND flash memory devices, all the NAND cell strings of the memory blocks of the memory array are formed in one well.

Figure 3:
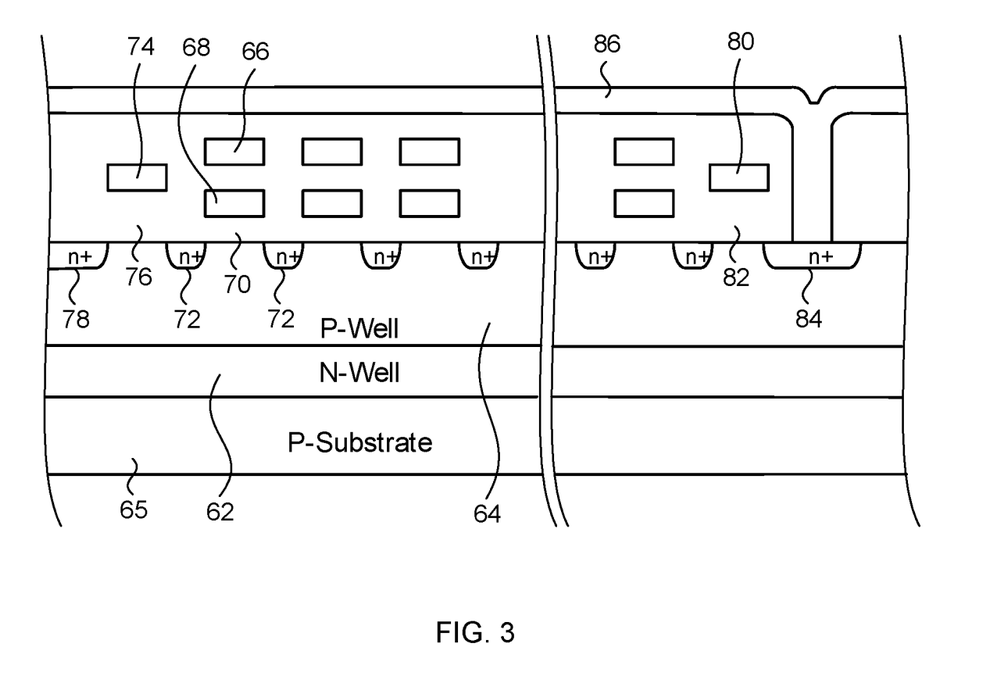
FIG. 3 is a cross section diagram of a planar type NAND cell string.

FIG. 3 is a cross section diagram of a NAND cell string 50, in particular a planar type NAND cell string having the equivalent circuit diagram shown in FIG. 2. Each flash memory cell includes a polysilicon wordline 66 and a polysilicon floating gate 68, where the floating gate 68 is formed over a thin gate oxide 70. On either side of thin gate oxide 70 and formed within p-type well 64 are n-type diffusion regions 72. The p-type well 64 is formed in an n-type well 62, which itself is formed in the p-type substrate 65. The sourceline select device 56 includes a polysilicon gate 74 formed over a thick gate oxide 76, and an n-type diffusion region 78 acting as the source line SL. Diffusion region 78 is shared with all the NAND cell strings in the memory block, as illustrated in FIG. 2. The string select device 52 includes a polysilicon gate 80 formed over a thick gate oxide 82, and an n-type diffusion region 84 that is electrically connected to a bitline 86. The particular NAND cell string example of FIG. 3 is one example of a planar NAND cells. Variants of the planar NAND cell string are possible in which different materials are used instead of those mentioned. For example, metal wordlines can be used instead of polysilicon wordlines, and silicon nitride layers can be used instead of polysilicon gates. Regardless of the types of materials used, the planar NAND cell strings referred to from this point on can be constructed with any materials.

As is well known in the art, NAND flash memory devices are block erasable, meaning that individual memory blocks can be selectively erased through Fowler-Nordheim (F-N) tunneling, based on a block address or other selection signal. In order to erase a memory block such as memory block 58 of FIG. 2, the wordlines of the selected memory block are biased to 0V, SSL and GSL are floated, and both the n-well 62 and the p-well 64 formed within the substrate 65 are biased to V_ERASE. V_ERASE is a high voltage generated by a charge pump, and in example flash memory devices can be about 20V. Because SSL and GSL are floated during the erase operation, both SSL and GSL are self-boosted when V_ERASE is applied to n-well 62 and p-well 64 due to the capacitive coupling between the wells and SSL and GSL. Depending on the capacitive coupling ratio, GSL and SSL can be boosted to approximately 80% to 90% of V_ERASE. SL and all bitlines are floated during the erase operation, and eventually self-boost to about V_ERASE-0.6V. Those skilled in the art will understand that the forward bias p-n junction voltage drop across p-well 64 to the n-type diffusion regions 78 and 84. Under these erase bias conditions, trapped electrons (charge) in the floating gate of the flash memory cells are emitted uniformly to the substrate. The threshold voltage (Vth) of the erased flash memory cell in this example becomes negative, meaning that the erased cell will turn on with a gate bias of 0V.

Since unselected memory blocks may reside in the same p-well 64 as the selected memory block, these unselected memory blocks must be inhibited from being erased. A self-boosting erase inhibit scheme described in U.S. Pat. No. 5,473,563 is widely used in NAND flash memory devices to prevent erasure of unselected memory blocks. To prevent erasure of flash memory cells in unselected memory blocks using the self-boosting erase inhibit scheme, all wordlines in unselected memory blocks are floated. Therefore floated wordlines in the unselected memory blocks are boosted to about 90% of V_ERASE when the p-well 64 rises to V_ERASE, by capacitive coupling between the p-well 64 and the wordlines. It should be understood that the final boosted voltage level on the floating wordlines is determined by the coupling ratio between the substrate and wordlines. The boosted voltage of the wordlines in the unselected memory blocks is effective for reducing the electric field between the p-well 64 and the wordlines, thereby minimizing unintended erasure of data stored therein.

One solution to address the problems noted above is to fabricate a non-volatile memory device with at least one memory block formed in different pocket wells. Each pocket well can include for example a device well within which the NAND cell strings of the memory block(s) are formed in, and isolation wells for isolating the substrate from the device wells. Hence, at least one memory block is electrically isolated from another memory block. At least one pocket well is selectively coupled to an erase voltage during an erase operation, such that unselected pocket wells are inhibited from receiving the erase voltage, thereby minimizing erase disturb in the unselected pocket wells. Because each pocket well has a small area relative to a single well that includes all memory banks, the capacitance of each pocket well is small. This results in several advantages such as higher speed erasing or reduced charge pump size. Commonly owned US Patent Publication 20110170352 describes this technique of dividing the cell array into multiple pocket wells, each of which includes at least one memory block and receives an erase voltage.

Figure 4:
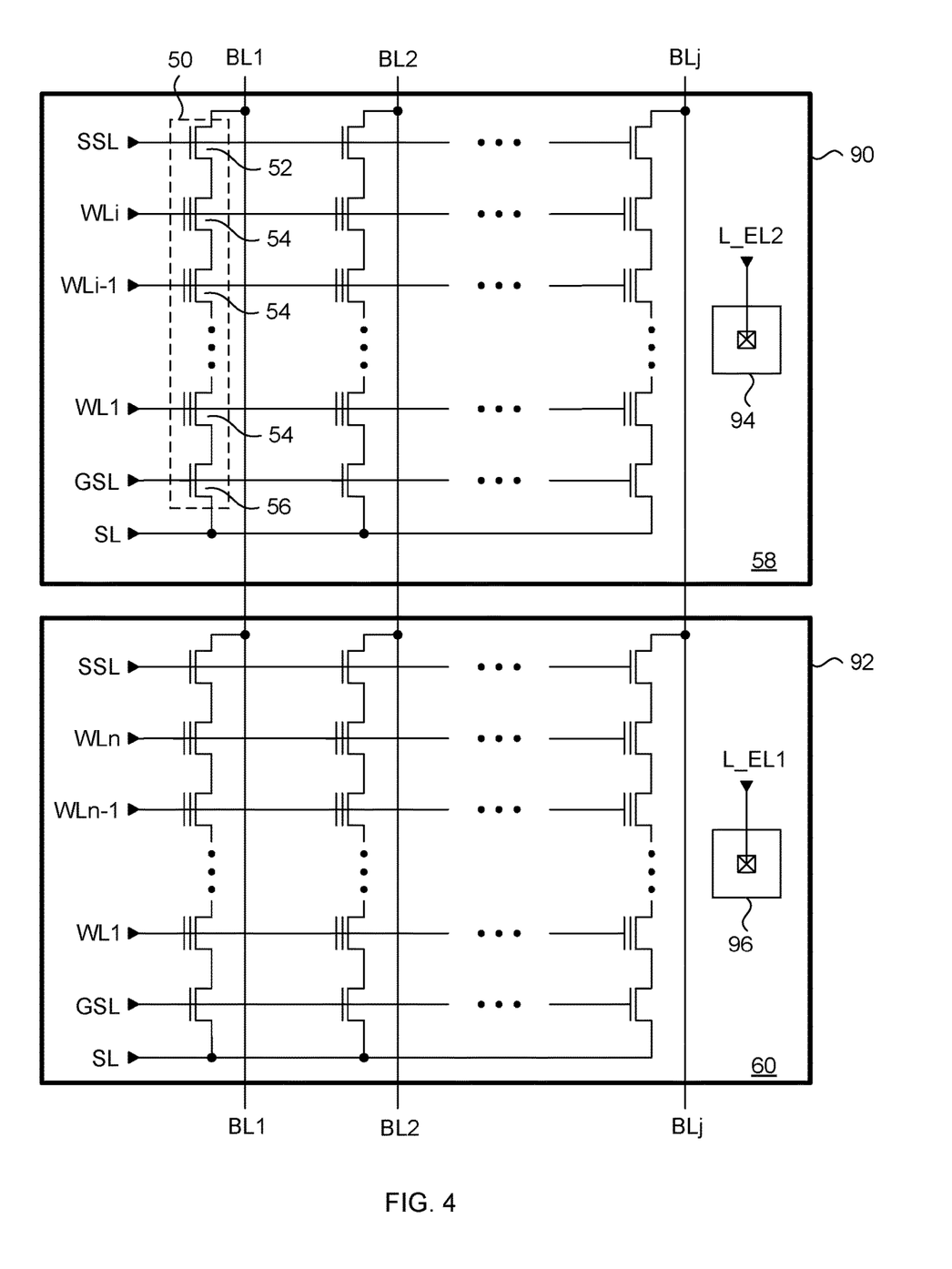
FIG. 4 is a circuit schematic showing selectively erasable planar NAND cell memory blocks, according to an embodiment of the present disclosure.

FIG. 4 is shows the memory blocks of FIG. 2 each formed in respective pocket wells having dedicated erase voltage connections formed therein. In FIG. 4, the same features that appear in FIG. 2 are designated with the same reference numerals. In FIG. 4, the NAND cell strings 50 of memory block 58 are formed within a pocket well delineated by box 90 while the NAND cell strings 50 of memory block 60 are formed within a pocket well delineated by box 92. Pocket wells 90 and 92 are electrically isolated from each other. Assuming in the present example that the pocket well is a pocket P-well, a P+ region 94 is formed as a contact region for connection to a local erase line L_EL2 that provides an erase voltage to memory block 58. Similarly, a P+ region 96 is formed for connection to a different local erase line L_EL1 that provides an erase voltage to memory block 60. Local erase lines L_EL1 and L_EL2 are selectively applied to their respective memory blocks based on a block address, but both carry the same erase voltage V_ERASE, thereby allowing individual memory blocks to be erased. Each pocket well 90 and 92 can be sized to include more than 1 memory block. It should be understood from this point forward that local erase lines can be driven to VSS or the erase voltage V_ERASE.

The same principles apply to newer 3D NAND flash memory cells, in which the NAND cell string is stacked to form a substantially vertical pillar relative to the x-y plane of the substrate surface of the semiconductor chip.

Figure 5A:
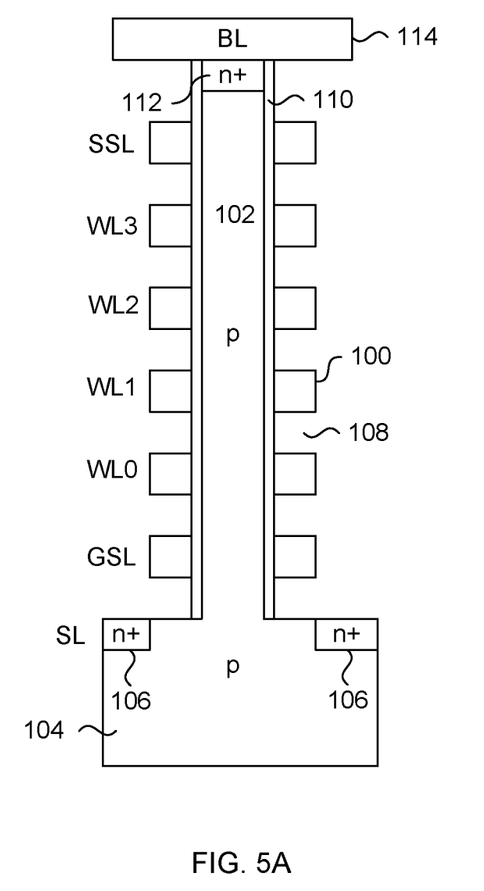
FIG. 5A is a cross section diagram of an example vertical channel type NAND cell string.

FIG. 5A is a cross-sectional view of a vertical channel type NAND cell string where gates 100 of the memory cells, the SSL and GSL transistors wrap around vertically aligned bodies 102, thus forming a gate-all-around structure. In the given examples as well as throughout the description, it is assumed that NAND cell transistors consist of n-channel transistors on p-type (or undoped) substrate. However, the NAND cell transistors can be p-channel transistors formed on n-type substrate, or the substrate may consist of undoped silicon. In the present example of FIG. 5A, the body is p-type, and is electrically connected to the p-type cell substrate 104 without any junction in between. In other words, body 102 and substrate 104, which are of the same impurity type, are electrically connected with each other continuously through the same doping type. N+ type diffusion regions 106 functions as the source line (SL) of the cell string. The space 108 between the gates 100 is filled with dielectric material. A type of gate dielectric 110 is formed between the gates 100 and the body 102. Another n+ diffusion layer 112 is formed at the top portion of the body 102 for making electrical contact with a bitline (BL) 114. This type of vertical channel NAND cell string is erased in the same manner that the previously described planar NAND cell string is erased. Because the body 102 is directly connected to the substrate 104, the body 102 will receive an erase voltage applied to the substrate 104.

Figure 5B:
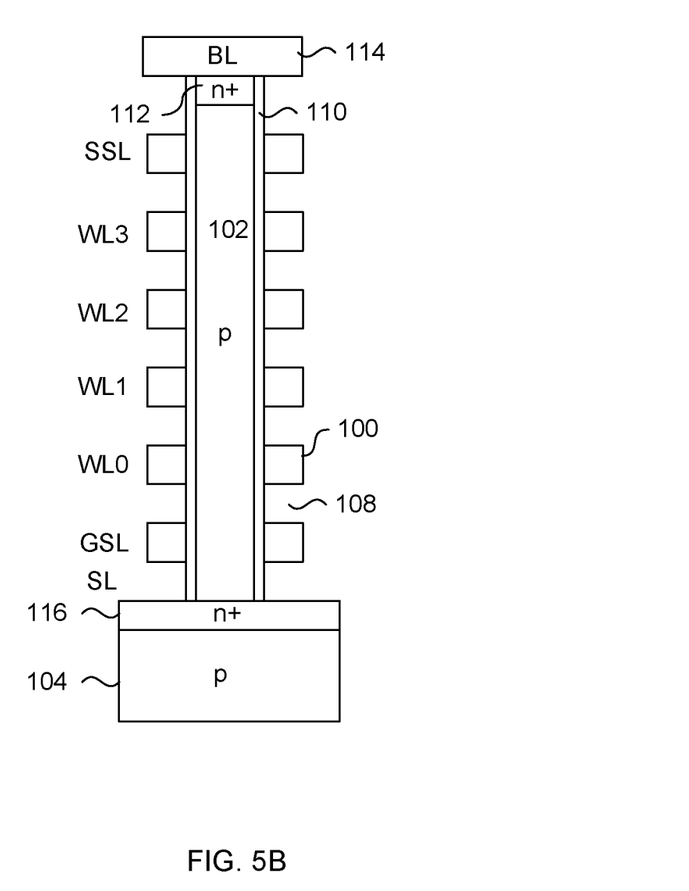
FIG. 5B is a cross section diagram of an example alternate vertical channel type NAND cell string.

FIG. 5A is one example of a vertical channel NAND cell string. Another type of vertical channel NAND cell string is shown in FIG. 5B. The vertical channel NAND cell string of FIG. 5B is similar to the one shown in FIG. 5A, hence the reference numbers appearing in FIG. 5B refer to the same numbered features shown in FIG. 5A. The main difference of the vertical channel NAND cell string of FIG. 5B over the vertical channel NAND string of FIG. 5A is that the p-type body 102 is isolated from the p-type cell substrate 104 by an n+ type diffusion layer 116 which forms the source line (SL) of the cell string. The NAND cell strings thus have an opening at the bottom where the body 102 and substrate 104, which are of the same impurity type, are electrically connected with each other continuously through the same doping type. Another difference is that the source line SL is formed as smaller n+ diffusion regions 116 spatially proximate to the GSL transistors.

Figure 6:
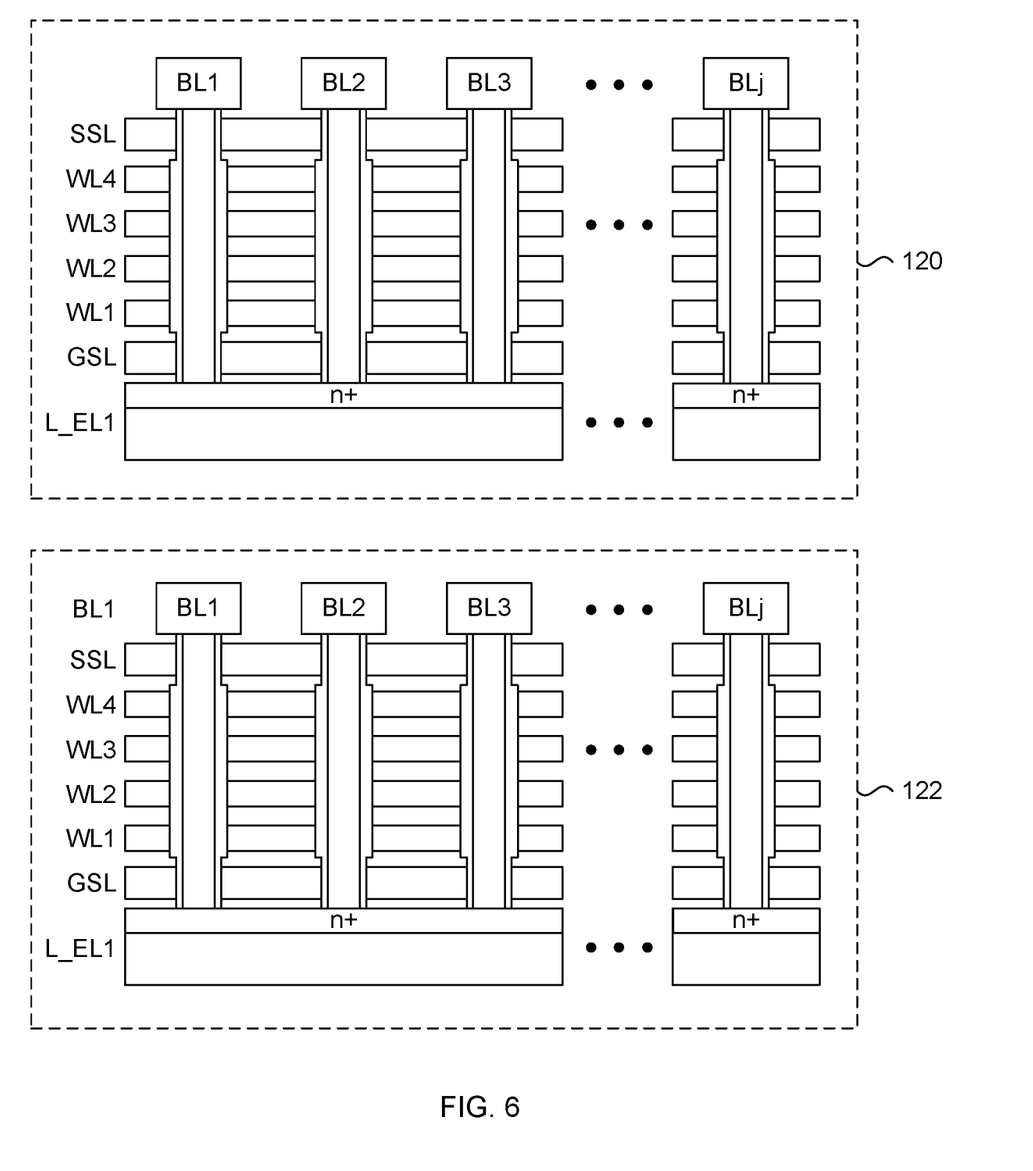
FIG. 6 is a schematic showing selectively eraseable vertical channel type NAND cell memory blocks, according to an embodiment of the present disclosure.

For the vertical channel NAND cell string of FIG. 5B, the bodies of different NAND cell strings are located in separate substantially vertical pillars and are therefore isolated from each other as well as from the P-type substrate. Erase occurs by injecting holes into the isolated body through GIDL current by biasing the source line (SL) at an appropriate erase voltage level. Accordingly, it is possible to charge the bodies of one selected memory block provided that the source line of the selected memory block is isolated from source lines corresponding to other memory blocks. This is illustrated in FIG. 6, which shows vertical channel NAND cell strings of memory block 120 having their source line connected to local erase line L_EL1 and vertical channel NAND cell strings of memory block 122 having their source line connected to local erase line L_EL2. Because the source lines of memory blocks 120 and 122 are isolated from each other and separately controlled, either memory block 120 and 122 can be selectively erased.

FIGS. 5A and 5B are examples of vertical channel NAND cell strings, in which the NAND cells are arranged such that the channel of the NAND cell string extends in the generally vertical direction from the surface of the substrate. Other types of vertical channel NAND strings may have channels with portions that are orthogonal to the substrate surface and portions that are parallel to the substrate surface. Hence a vertical channel NAND cell string can include at least one portion that extends in a direction orthogonal or substantially vertical to the plane of the semiconductor substrate.

According to embodiments of the present disclosure, the erase voltage path for selectively erasing memory blocks of the memory array is integrated into the existing hierarchical row decoding structure of the memory device. This avoids the need to form dedicated selection circuitry on the memory device for providing the erase voltage to one or more selected memory blocks. Therefore, chip area is minimized thereby reducing overall manufacturing cost for the memory device.

Figure 7:
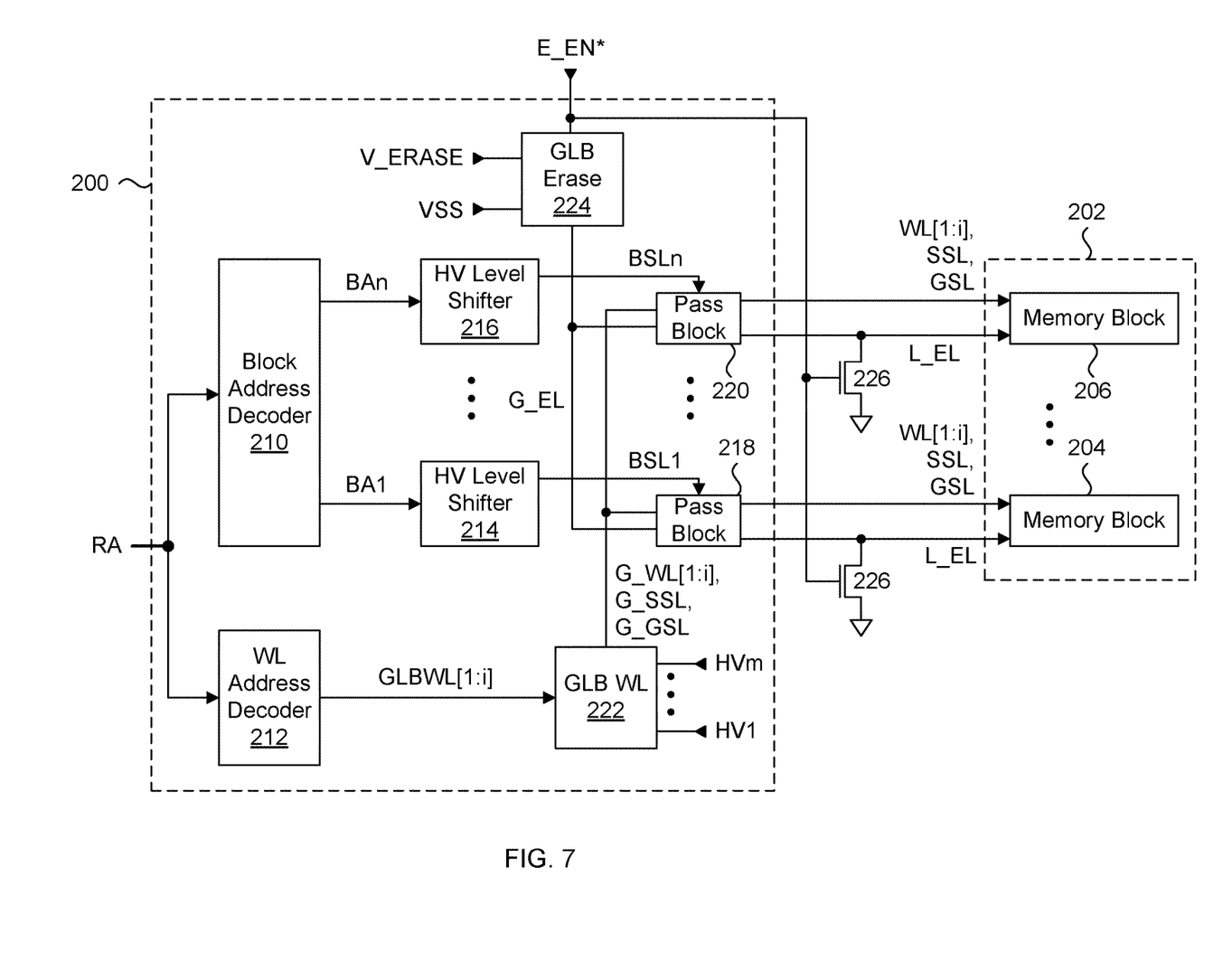
FIG. 7 is a block diagram of a row decoder and a non-volatile memory array, according to an embodiment of the present disclosure.

FIG. 7 is a block diagram of a row decoding circuit with integrated erase voltage path which selectively provides an erase voltage to the bodies of non-volatile memory cells of at least one memory block, according to an embodiment of the present disclosure. FIG. 7 shows a row decoder 200 for providing row signals to a memory array 202 having a first memory block 204 up to and including a last memory block 206. Only two memory blocks are shown in the present example, but those skilled in the art understand that memory array 202 includes a plurality of addressable memory blocks. The row decoder 200 includes logic circuits designed to access any one of the memory blocks in response to a row address RA, and may include a variety of voltage pump circuits for providing the voltages required for executing non-volatile memory operations, such as read, program and erase operations by example. The presently shown example row decoder 200 and memory array 202 is configured for NAND flash memory, but is equally applicable to other non-volatile memories where selective application of an erase voltage to predetermined units of memory cells, such as memory blocks, is required.

The row decoder 200 includes a block address decoder 210, a wordline address decoder 212, high voltage level shifters 214 to 216, pass block circuits 218 to 220, a global wordline driver circuit 222 and a global erase voltage driver circuit 224. The block address decoder 210 decodes a block address portion of the row address RA to provide block address signals BA1 to BAn, where n is an integer value representing a last block address signal. In the present example, only one block address signal BA1 to BAn is driven to the active voltage level in response to any row address RA during read, program and erase operations. An optional feature of the embodiment of FIG. 7 is the addition of discharge devices 226 connected to all the local erase lines L_EL. In the present example, discharge devices 226 are n-channel transistors connected between a respective L_EL and ground. The gate terminals of the discharge devices 226 receive an active low logic level erase enable signal E_EN*, which is also received by global erase voltage driver circuit 224. An active low logic level signal is appended with an "*" to indicate that E_EN* is at the low logic level during an erase operation.

Each of the high voltage level shifters 214 to 216 receives one block address signal BA1 to BAn respectively, and shifts the voltage to a higher voltage range than provided by the circuits of block address decoder 210. The high voltage level shifters 214 to 216 can include charge pumps or receive high voltages from a global charge pump circuit (not shown). Such circuits are well known in the art. Each of the high voltage level shifters 214 to 216 therefore provides a level shifted block select signal BSL1 to BSLn to respective pass block circuits 218 to 220. It is noted that only one of BSL1 to BSLn is driven to a high voltage level when the corresponding block address BA1 to BAn is driven to the active logic level by block address decoder 210. One of pass block circuits 218 to 220 is enabled when its respective block select signal BSL is driven to the high voltage level. The effect and purpose of the high voltage level block select signal is described later.

The wordline address decoder 212 decodes a wordline address portion of the row address RA to activate one global wordline of a set of global wordlines GLBWL[1:i], where each global wordline corresponds to a row or page of NAND memory cells in a memory block. The active and inactive GLBWL[1:i] signals are provided to global wordline driver circuit 222. In the present example, memory blocks 204 to 206 each include a total of "i" rows. The global wordline driver circuit 222 drives global wordlines G_WL[1:i] (G_WL1, G_WL2 to G_WLi), a global string select line G_SSL and a global source select line G_GSL to all the pass block circuits 220 in parallel. These signals are driven with the appropriate voltage levels ranging from VSS to high voltages HV1 to HVm depending on the operation being executed, where the high voltages can be provided by charge pump circuits (not shown). The global erase voltage driver circuit 224 drives a global erase line G_EL with either an erase voltage V_ERASE or VSS depending on the operation being executed, which is provided to all the pass block circuits 218 to 220.

During read or program operations, a selected G_WL as determined by the wordline address decoder 212 is driven by the global wordline driver circuit 222 to the necessary voltage level to effect read or programming operations, while the remaining unselected wordlines, G_SSL and G_GSL are driven to other voltage levels required by the read or program operations. During erase operations, all the G_WL[1:i] lines are driven to VSS. During read and programming operations, the global erase voltage driver circuit 224 drives global erase line G_EL with the VSS voltage level. This can be controlled by the erase enable signal E_EN* at the inactive high logic level, which turns on discharge devices 226 to ensure that all local erase lines L_EL are discharged to VSS. During erase operations on the other hand, erase enable signal E_EN* is at the active low logic level to enable the global erase voltage driver circuit 224 to drive G_EL to the V_ERASE voltage level. Accordingly, discharge devices 226 are turned off during an erase operation.

In order to transfer or pass the global row signals G_WL[1:i], G_SSL, G_GSL and the global erase line G_EL to one of memory blocks 204 to 206, one of corresponding pass block circuits 218 to 220 is enabled by a block select signal BSL driven to a high voltage level. The block select signal BSL can be driven to a voltage level higher than the maximum voltage level the global row signals and the global erase signal are driven to, in order to ensure that the full voltage level of the global row signals and the global erase signal is passed to the memory block. The selected pass block circuit couples local wordline signals WL[1:i], a local string select signal SSL and a local source select signal GSL to the NAND cell strings of the memory block, and a local erase line L_EL to the substrate within which the NAND cell strings are fabricated. For example as shown in FIG. 4, separate L_EL lines can be connected to the substrates of different memory blocks that are electrically isolated from each other.

In summary, the block address decoder 210 selectively enables one of pass block circuits 218 to 220 via any one of BSL1 to BSLn driven to a high voltage level, which then enables the corresponding pass block circuit (218 to 220) to pass the G_WL[1:i], G_SSL, and G_GSL signals, and the erase voltage carried by the global erase line G_EL to a corresponding memory block. Therefore a selected memory block receives the V_ERASE voltage via G_EL along with the other signals that are provided to the memory block in an erase operation. Therefore, additional decoding circuitry overhead is minimized as the erase voltage path is integrated with the decoding circuitry used for providing the other memory block signals. In an alternate configuration, the block address decoder 210 can be configured to drive more than one of block address signals BA1 to BAn concurrently, thereby concurrently enabling more than one pass block circuit for concurrently erasing a corresponding number of memory blocks.

Figure 8:
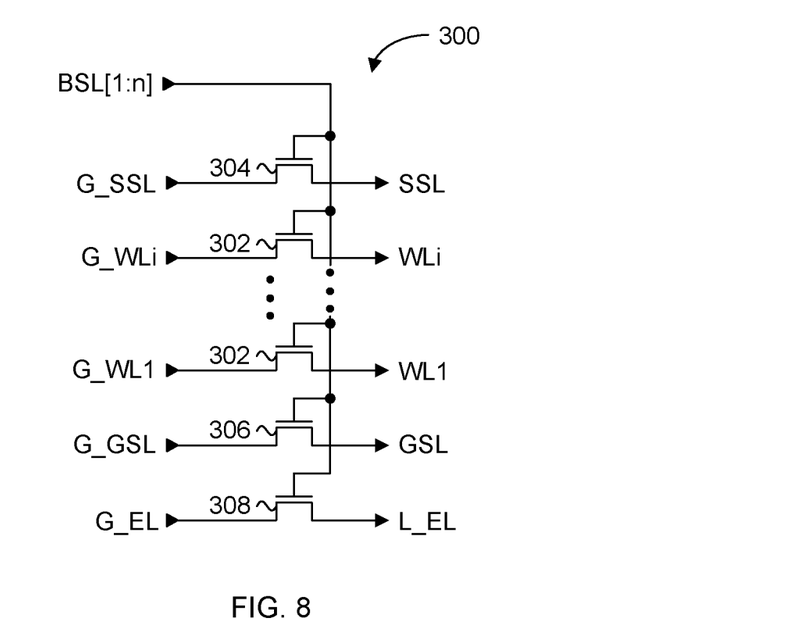
FIG. 8 is a circuit schematic of the pass block circuit of FIG. 7, according to an embodiment of the present disclosure.

FIG. 8 is a circuit schematic of one pass block circuit shown in FIG. 7, according to one embodiment of the present disclosure. The pass block circuit 300 of FIG. 8 includes a plurality of pass gates shown in the present embodiment as n-channel pass transistors, which consist of wordline pass transistors 302, string select signal pass transistor 304, source select pass transistor 306, and erase voltage pass transistor 308. Each of these pass transistors has its gate terminal electrically coupled to one of the block select signals BSL[1:n] for passing the G_SSL, the G_WL1 to G_WLi, and the G_GSL signals to the NAND cell strings of the memory block as via the SSL, WL1 to WLi and GSL lines, and for passing the erase voltage V_ERASE provided by global erase line G_EL to the cell body of the memory block via local erase line L_EL. Alternately, transmission gates instead of the n-channel pass transistors can be used. It is clearly seen from the schematic of FIG. 8 that the received BSL[1:n] signal at the low logic level such as VSS, turns off all the pass gates to decouple the global row signals and the global erase voltage from the memory block. This occurs when the corresponding memory block is unselected. On the other hand, if the corresponding memory block is selected for an erase operation, the received BSL[1:n] signal is driven to a high voltage level to pass the global row signals and the global erase voltage to the memory block.

Figure 9:
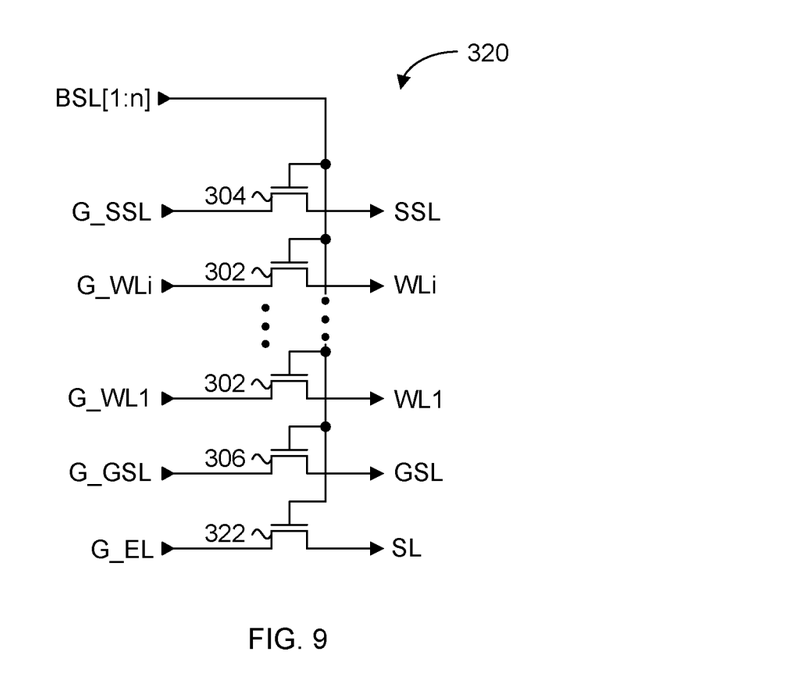
FIG. 9 is a circuit schematic of the pass block circuit of FIG. 6, according to an alternate embodiment of the present disclosure.

The above mentioned embodiments are suitable for the planar type NAND cell strings, such as those shown in FIG. 2. For the vertical channel NAND cell memory blocks shown in FIG. 6, a similar erase voltage path integrated into the row decoding circuitry can be used. In fact, the same row decoder 200 of FIG. 7 can be used where the only difference is the connection of the local erase voltage to the memory block. FIG. 9 shows a pass block circuit according to an alternate embodiment of the present disclosure. Pass block circuit 320 includes the same numbered pass gates which appear in FIG. 8, except for erase voltage pass transistor 322 which now passes the global erase voltage provided by global erase line G_EL to a line connected to the source line SL of the vertical channel NAND cells strings of one memory block. During an erase operation, a selected memory block will have its corresponding pass block circuit 320 enabled to pass the high voltage erase voltage of G_EL to the SL of the memory block. Otherwise, the global row signals and the global erase voltage are decoupled from the memory block.

Figure 10:
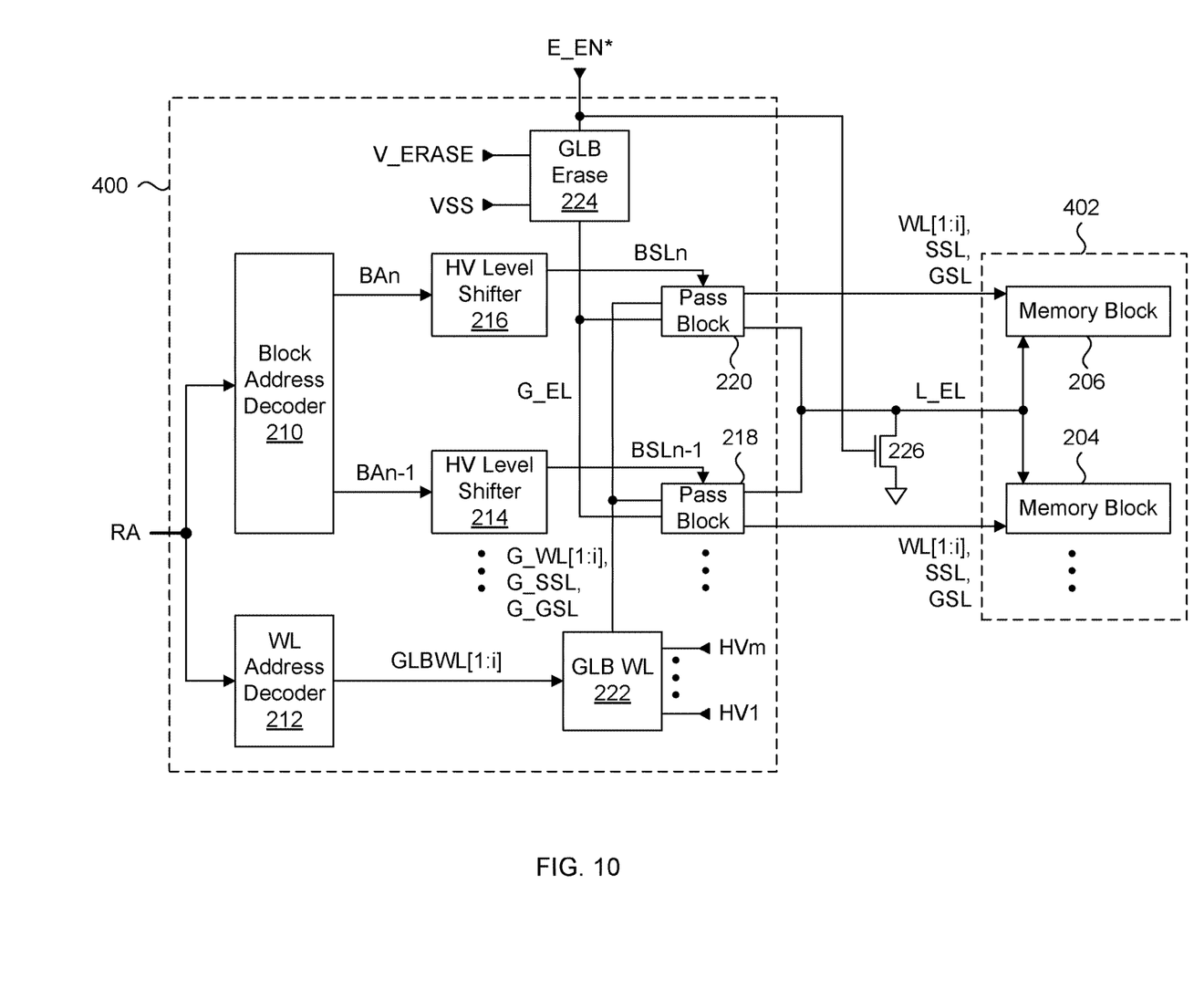
FIG. 10 is a block diagram of a row decoder and a non-volatile memory array, according to an alternate embodiment of the present disclosure.

In an alternate embodiment of the present disclosure, at least two memory blocks electrically isolated from each other can share a single row decoded local erase voltage. FIG. 10 is a block diagram of a row decoding circuit with integrated erase voltage path which selectively provides an erase voltage shared by two memory blocks of a memory array, according to an alternate embodiment of the present disclosure. The embodiment of FIG. 10 is similar to the embodiment of FIG. 7, and hence includes features having the same numbers. In the embodiment of FIG. 10, the row decoder 400 includes the same circuit blocks of row decoder 200 of FIG. 7. The memory array 402 is similar to memory array 202 of FIG. 7. In row decoder 400, a last high voltage level shifter 216 and a second to last high voltage level shifter 214 are shown. Similarly, a last pass block circuit 220 and a second last pass block circuit 218 are shown. In memory array 402, a last memory block and a second last memory block 204 are shown. These last and second last circuit blocks are typically located adjacent to each other on the semiconductor chip. The interconnection of the circuit blocks of row decoder 400 are the same as those in row decoder 200, with the exception of the output of pass block circuits 218 and 220.

In this embodiment, word lines WL[1:i], string select lines SSL and ground select lines GSL are unique to each memory block, however, one local erase line L_EL is shared among the two memory blocks 204 and 206. As shown in FIG. 10, the shared local erase line L_EL is connected to the global erase line G_EL via 2 pass gates belonging to pass block circuits 218 and 220. This same connection configuration is repeated for other pairings of pass circuit blocks and memory blocks that are not shown in FIG. 10. In an erase operation, if the block select line BSLn−1 enables pass block circuit 218, G_EL driven to the erase voltage level V_ERASE is passed to the substrate of both memory blocks 204 and 206. It is noted that while the global wordlines G_WL[1:i] biased to VSS are passed to the memory cells of selected memory block 204, the memory cells of memory block 206 are still inhibited from being erased. This is because the wordlines of memory block 206 are floating when pass block circuit 220 is unselected, therefore they are decoupled from G_WL[1:i] due to their floating wordlines, which is sufficiently effective for inhibiting cell erasure when the cell substrate is biased to the erase voltage level. The reverse would occur if the block select line BSLn enables pass block circuit 220, in which case the wordlines of memory block 204 are floating.

In an alternate configuration, the block address decoder 210 can be configured to drive more than one of block address signals concurrently, thereby concurrently enabling V_ERASE to be concurrently provided to multiple pairs of memory blocks 204 and 206.

According to a variant to the embodiment of FIG. 10, both memory blocks 204 and 206 are formed in the same pocket well which is electrically isolated from another pocket well shared by two other memory blocks. Similarly, two vertical channel NAND cell string memory blocks can be connected to the same SL.

According to yet other alternate embodiments of the row decoder and memory array arrangements shown in FIG. 7 and FIG. 10, a single memory device can incorporate combinations of the previously described embodiments. For example, some memory blocks of the memory array can be individually selected for erasure, while two or more memory blocks can share single decoded local erase voltage. In another example, some memory blocks of the memory array can be individually selected for erasure, while two or more memory blocks can share a common substrate selectable by one pass block circuit. In yet another example, a single memory device can include combinations of all three previously described configurations.

The previously described embodiments are not limited to memory arrays using the specifically shown types of vertical channel NAND cell strings and planar NAND cell strings. The previously described embodiments can be used with any type of vertical channel or planar NAND cell string where a substrate receives an erase voltage or a source line receives an erase voltage for inducing GIDL current.

In the embodiments described above, the device elements and circuits are connected to each other as shown in the figures for the sake of simplicity. In practical applications these devices, elements circuits, etc., may be connected directly to each other or indirectly through other devices elements, circuits, etc. Thus, in an actual configuration, the elements, circuits and devices are coupled either directly or indirectly with each other.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A 3D NAND Flash memory chip comprising:
an underlying substrate having a p-type region;
a first n-type source line region in a first memory block and a second n-type source line region in a second memory block, both of the first n-type source line region and the second n-type source line region being above the p-type region, the first and the second n-type source line regions being isolated from each other and not adjoining each other;
a first plurality of pillars and a second plurality of pillars, each of the first plurality of pillars extending in a vertical direction from the first n-type source line region and each of the second plurality of pillars extending in the vertical direction from the second n-type source line region, each pillar of the first plurality of pillars and the second plurality of pillars containing a pillar body and a plurality of n-channel memory cell transistors, each n-channel memory cell transistor comprising a gate wrapping around the pillar body to form a gate-all-around structure, the gate of each n-channel memory cell transistor coupled to a corresponding word line, and the plurality of n-channel memory cell transistors in each pillar vertically stacked to form a three dimensional vertical channel NAND string structure; and
a first local erase line connected to the first n-type source line region, each of the first n-type source line region and the second n-type source line region continuously extending in a word line direction, the word line direction being orthogonal to a bit line direction and orthogonal to the vertical direction,
such that the first n-type source line region contacts and terminates bottom ends of first multiple pillars of the first plurality of pillars, the first multiple pillars of the first plurality of pillars being arranged in the word line direction, the first n-type source line region completely separating, in the vertical direction, each pillar body of the first multiple pillars of the first plurality of pillars from the p-type region,
and the second n-type source line region contacts and terminates bottom ends of second multiple pillars of the second plurality of pillars, the second multiple pillars of the second group of pillars being arranged in the word line direction, the second n-type source line region completely separating, in the vertical direction, each pillar body of the second multiple pillars of the second plurality of pillars from the p-type region.

2. The 3D NAND Flash memory chip of claim 1, wherein the first multiple pillars of the first plurality of pillars are formed to enable a GIDL current to be applied between the first n-type source line region and each pillar body of the first multiple pillars of the first plurality of pillars during an erase operation.

3. The 3D NAND Flash memory chip of claim 1 further comprising a second local erase line connected to the second n-type source line.

4. The 3D NAND Flash memory chip of claim 1, wherein the first local erase line is shared by the first memory block and the second memory block.

5. The 3D NAND Flash memory chip of claim 1 further comprising a separate n-type diffused region at a top end of each pillar of the first plurality of pillars and the second plurality of pillars.

6. The 3D NAND Flash memory chip of claim 1, wherein the first local erase line has a main axis extending in the word line direction.

7. The 3D NAND Flash memory chip of claim 1, wherein the first local erase line is connected to one of a source and drain of a pass transistor, and a first global erase line is connected to the other of the source and drain of the pass transistor.

8. The 3D NAND Flash memory chip of claim 1, wherein the first memory block and the second memory block are arranged proximate to each other in a bit line direction.

9. A 3D NAND Flash memory chip, comprising:
an underlying substrate having a p-type region;
a first n-type source line region in a first memory block and a second n-type source line region in a second memory block, both of the first n-type source line region and the second n-type source line region being above the p-type region, the first and the second n-type source line regions being isolated from each other and not adjoining each other;
a first plurality of pillars and a second plurality of pillars, each of the first plurality of pillars extending in a vertical direction from the first n-type source line region and each of the second plurality of pillars extending in the vertical direction from the second n-type source line region, each pillar of the first plurality of pillars and the second plurality of pillars containing a pillar body and a plurality of memory cells that are vertically stacked to form a three dimensional structure; and
a first local erase line connected to the first n-type source line region, each of the first n-type source line region and the second n-type source line region continuously extending in a word line direction, the word line direction being orthogonal to a bit line direction and orthogonal to the vertical direction,
wherein the first n-type source line region contacts and terminates bottom end of first multiple pillars of the first plurality of pillars, the first multiple pillars of the first plurality of pillars being arranged in the word line direction, the first n-type source line region separating each pillar body of the first multiple pillars of the first plurality of pillars from the p-type region,
wherein the second n-type source line region contacts and terminates bottom end of second multiple pillars of the second plurality of pillars, the second multiple pillars of the second group of pillars being arranged in the word line direction, the second n-type source line region separating each pillar body of the second multiple pillars of the second plurality of pillars from the p-type region,
and wherein the first local erase line is shared by the first memory block and the second memory block, and has a first portion extending in the word line direction and a second portion extending orthogonally from the word line direction and orthogonally from the vertical direction.

10. The 3D NAND Flash memory chip of claim 9, wherein the second portion connects to the first memory block and the second memory block.

11. The 3D NAND Flash memory chip of claim 9, wherein the first multiple pillars of the first plurality of pillars are formed to enable a GIDL current to be applied between the first n-type source line region and each pillar body of the first multiple pillars of the first plurality of pillars during an erase operation.

12. The 3D NAND Flash memory chip of claim 9 further comprising a second local erase line connected to the second n-type source line.

13. The 3D NAND Flash memory chip of claim 9, wherein the first local erase line is shared by the first memory block and the second memory block.

14. The 3D NAND Flash memory chip of claim 9 further comprising a separate n-type diffused region at a top end of each pillar of the first plurality of pillars and the second plurality of pillars.

15. The 3D NAND Flash memory chip of claim 9, wherein the first local erase line has a main axis extending in the word line direction.

16. The 3D NAND Flash memory chip of claim 9, wherein the first local erase line is connected to one of a source and drain of a pass transistor, and a first global erase line is connected to the other of the source and drain of the pass transistor.

17. The 3D NAND Flash memory chip of claim 9, wherein the first memory block and the second memory block are arranged proximate to each other in a bit line direction.

* * * * *